US010014644B2

(12) United States Patent
Eggimann et al.

(10) Patent No.: US 10,014,644 B2
(45) Date of Patent: Jul. 3, 2018

(54) APPARATUS AND METHOD FOR FORMING A WIRE LOOP

(75) Inventors: Reto Eggimann, Rothenburg (CH); Alfred Braun, Cham (CH)

(73) Assignee: KOMAX HOLDING AG, Dierikon (CH)

(*) Notice: Subject to any disclaimer, the term of this patent is extended or adjusted under 35 U.S.C. 154(b) by 1160 days.

(21) Appl. No.: 13/213,258

(22) Filed: Aug. 19, 2011

(65) Prior Publication Data

US 2012/0042985 A1 Feb. 23, 2012

(30) Foreign Application Priority Data

Aug. 19, 2010 (EP) ..................... 10173456

(51) Int. Cl.
| B21F 9/00 | (2006.01) |
| H01R 43/28 | (2006.01) |
| B21F 1/00 | (2006.01) |
| H01L 23/00 | (2006.01) |
| H01R 43/052 | (2006.01) |

(52) U.S. Cl.
CPC ............... H01R 43/28 (2013.01); B21F 1/00 (2013.01); B21F 9/002 (2013.01); H01L 24/78 (2013.01); *H01L 2224/78* (2013.01); *H01L 2924/00014* (2013.01); *H01R 43/052* (2013.01)

(58) Field of Classification Search
CPC .. B21F 1/00; B21F 1/002; B21F 1/006; B21F 1/06; B21F 1/008; B21F 7/00; B21F 9/00; B21F 9/002
USPC ......... 140/102, 102.5, 149, 123, 123.5, 104, 140/147; 72/422, 423
See application file for complete search history.

(56) References Cited

U.S. PATENT DOCUMENTS

| 2,072,284 A | * | 3/1937 | Voorhees | ................ B21C 37/12 |
| | | | | 140/92.2 |
| 3,813,862 A | | 6/1974 | Tsuchida | |
| 4,188,840 A | * | 2/1980 | Martschinke | ........... B25B 25/00 |
| | | | | 140/118 |
| 4,631,911 A | | 12/1986 | Young et al. | |
| 4,976,294 A | * | 12/1990 | Kudo | ..................... H01R 43/28 |
| | | | | 140/102 |
| 6,289,944 B1 | * | 9/2001 | Frommenwiler | ............. 140/149 |

(Continued)

FOREIGN PATENT DOCUMENTS

| EP | 1032095 A2 | 8/2000 |
| EP | 1073163 A1 | 1/2001 |

(Continued)

OTHER PUBLICATIONS

Isei JP 2008058036 A, computer translation from JPO.*

*Primary Examiner* — R. K. Arundale
*Assistant Examiner* — Pradeep C Battula
(74) *Attorney, Agent, or Firm* — William J. Clemens; Shumaker, Loop & Kendrick, LLP

(57) ABSTRACT

An apparatus for the formation of a wire loop comprises a wire drive for advancing a wire and a loop layer to grip a first end of the wire and to lay a wire loop. When the wire is advanced, the wire loop is formed into a selected size. The apparatus also includes a pull-out gripper and a sensor device, the pull-out gripper being configured to grasp the wire of the wire loop and, after grasping the wire of the wire loop, move relative to the loop layer, thereby tensioning the wire loop in a longitudinal direction. The sensor device can detect a twist in the wire loop.

17 Claims, 7 Drawing Sheets

(56) References Cited

U.S. PATENT DOCUMENTS

| | | | |
|---|---|---|---|
| 7,283,891 B2* | 10/2007 | Butscher | B21F 1/00 140/149 |
| 7,647,759 B2* | 1/2010 | Braun et al. | 57/2.3 |
| 2010/0269555 A1* | 10/2010 | Theis | B21D 43/105 72/4 |

FOREIGN PATENT DOCUMENTS

| | | |
|---|---|---|
| EP | 1691457 A1 | 8/2006 |
| GB | 2193124 A | 2/1988 |
| JP | H0785940 A | 3/1995 |
| JP | 2008058036 A * | 3/2008 |
| WO | 97/32370 A1 | 9/1997 |

* cited by examiner

APPARATUS AND METHOD FOR FORMING A WIRE LOOP

CROSS-REFERENCE TO RELATED APPLICATION

This application claims priority to European Patent Application No. 10173456.4, filed Aug. 19, 2010, which is incorporated herein by reference.

FIELD

The disclosure relates to an apparatus and a method for forming a wire loop.

BACKGROUND

Typically, in a wire-processing machine 1 such as is shown by reference to an example in FIG. 1, the wire 2 is unrolled from a roll or reel, or fed out of a drum (not shown). A wire drive 3 pulls the wire 2 into the wire-processing machine 1. The corresponding direction of movement is indicated in FIG. 1 by the arrow P1. A loop layer 4 is employed which forms a loop 2.1 from a predefined section of the wire 2. When doing so, the loop layer 4 grasps the leading wire end of the wire 2 and, through a turning movement, forms the loop 2.1, which, through further advance of the wire 2, is brought to the desired length. The beginning of this process is shown in FIG. 1. Here, the loop 2.1 is still very small.

After separation of the loop 2.1, a transfer unit 5, such as is known, for example, from patent application EP1073163-A1, takes over the two ends of the loop 2.1 and, by a transverse movement in direction P3, brings them to a so-called de-twisting apparatus 6.

Known from patent application EP1691457-A1 is a corresponding wire-processing machine 1 with loop layer 4, transfer unit 5, and de-twisting apparatus 6, which allows the twist to be removed from a wire loop 2.1. Here, this takes place with a de-twisting apparatus 6, which is equipped with two turnable wire grippers 6.1, 6.2, which, at the instant shown in FIG. 1, hold a second wire-loop 2.2. The twist in this second wire loop 2.2 is removed by at least one of the two wire grippers 6.1, 6.2 executing de-twisting turns of a certain value about a horizontal axis counter to the direction of twist of the wire-loop 2.2.

A potential disadvantage of this approach is that the direction and angle of this de-twisting movement is often previously determined by trials and saved. Another possible disadvantage is that these values are not always constant over the length of the wire 2 that is fed to the wire-processing machine 1 and that long wire loops do not succeed in every case in removing the twist, since the loops can cross multiple times and unfavorably.

In at least some cases, crossing of the wire-loops is a problem in the relevant processes.

SUMMARY

In some embodiments, crossing of the wire loops is prevented by the wire, during formation of the loop, being held with a pull-out gripper, and optionally also being pulled out.

According to an embodiment, the pull-out gripper is so embodied that it can recognize the direction of the twist in the loop and/or the twist-free state of the loop.

According to another embodiment, the twist in the loop and/or the twist-free state is determined by a sensor device.

A further embodiment contains a pull-out gripper, which can recognize the twist of a loop and/or the twist-free state of the loop, and a sensor device.

In some cases, with a stretched loop, the two wire ends are transferred to a de-twisting apparatus according to EP1691457-A1, which performs the de-twisting according to the direction determined by the pull-out gripper and/or the sensor device, until the pull-out gripper and/or the sensor device recognizes the twist-free state of the loop.

At least some embodiments are suitable for a wire-processing machine according to EP1691457-A1.

BRIEF DESCRIPTION OF THE DRAWINGS

The present disclosure is explained in more detail by reference to the attached figures. Shown are in.

DETAILED DESCRIPTION

There follows a description of the disclosed technologies by reference to an embodiment which is based on a wire-processing machine 1 according to EP1691457-A1. At least some embodiments of the disclosed technologies can, however, also used with other wire-processing machines.

Figure 2A:
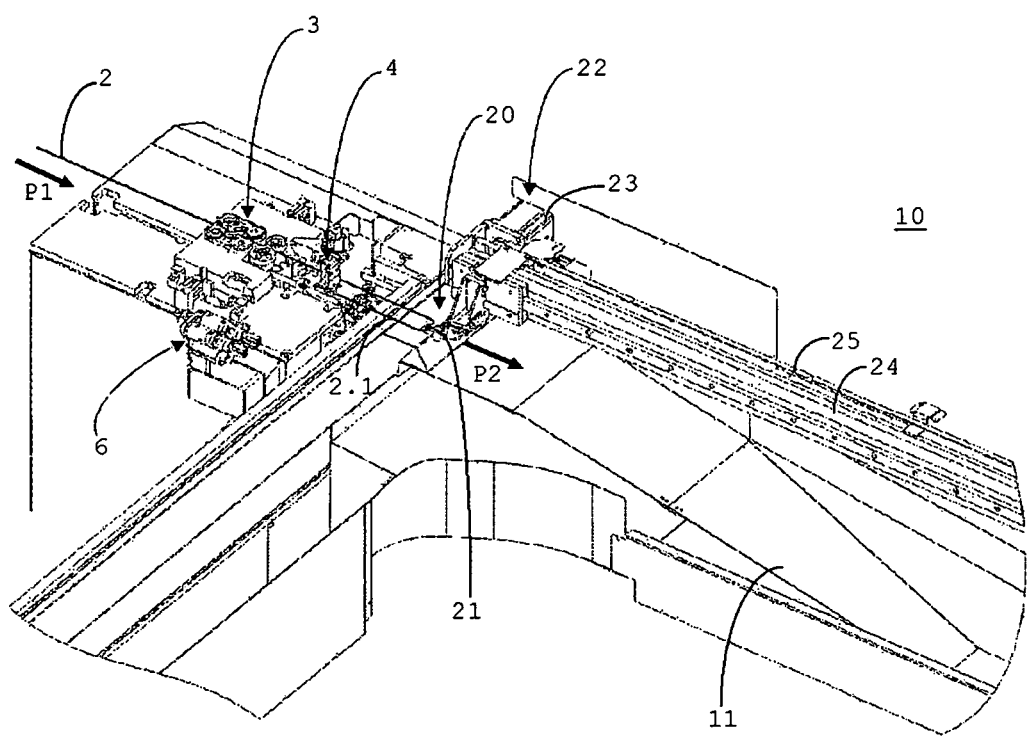
FIG. 2A, a three-dimensional view of a part of an apparatus with pull-out gripper in a first instantaneous state.

FIG. 2A shows a perspective view of a part of an apparatus 10 with pull-out gripper 20. The apparatus 10 is designed for the production of a wire-loop 2.1 of a wire-piece.

Figure 1:
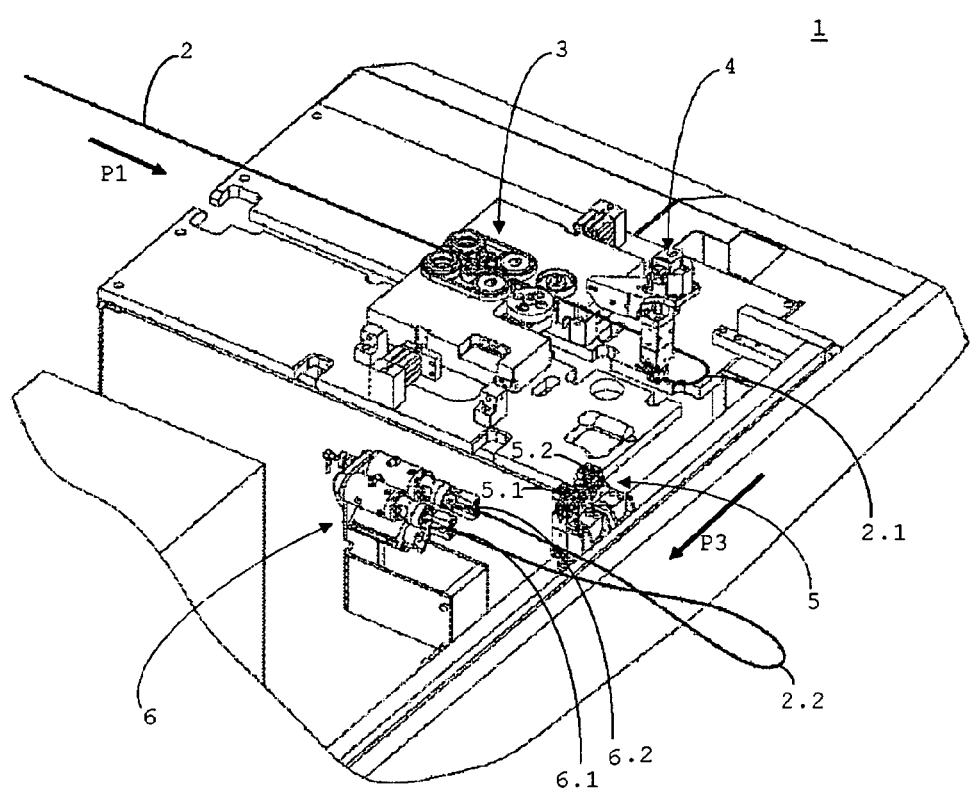
FIG. 1, a three-dimensional view of a part of a previously known wire-processing machine.

The apparatus 10 contains means 3, for example a correspondingly executed wire-drive 3, to insert and hold a trailing end of the wire-piece. It further contains means 4, for example in the form of a loop-layer 4 similar to FIG. 1. The loop-layer 4 grasps the leading end of the wire 2 and, with a swivel movement (for example a rotation of 180°), lays the wire-loop 2.1. The wire-drive 3 then advances the wire 2 until the desired length of the wire-loop 2.1 is attained, or the wire-loop 2.1 in the desired size is formed.

The apparatus 10 additionally contains a so-called pull-out gripper 20. The pull-out gripper 20 has at least two basic functions. Firstly, the pull-out gripper 20 serves to grasp an area of the wire piece which is located between the leading end and the trailing end of the wire piece. For this purpose, the pull-out gripper 20 has a gripper 21. Secondly, the pull-out gripper 20 holds the wire loop 2.1 taut by applying to it slight tension in lengthwise direction. For this purpose, the pull-out gripper 20 contains a movement apparatus 22 which makes it possible to move the gripper 21 relative to the means 3, 4 after grasping has occurred. This movement can take place in the direction of an arrow P2, as indicated in FIG. 2A. The movement apparatus 22 can, however, also execute a movement in another direction, e.g. diagonal to, or along, a curved path in which the relative distance between the loop-layer 4 and the gripper 21 is enlarged.

In at least some embodiments, the movement apparatus 22 contains a motor 23, possibly a servomotor 23. The movement apparatus 22 of the pull-out gripper 20 can, however, also be coupled for movement purposes to another movement apparatus, for example to the wire-drive 3. In this case, the pull-out gripper 20 needs no motor of its own.

In some cases, the movement apparatus 22 contains a linear axle 24 and a belt 25 which is driven by the motor 23, possibly a toothed belt 25. The belt 25 transfers a rotation movement of the motor 23 to the gripper 21 so that the latter changes its position along the linear axle 24.

In further embodiments, the apparatus 10 contains a wire-tray 11, which is arranged below the movement apparatus 22 so that, after the wire-loops 2.1 have been de-twisted, they can be laid in the wire-tray 11.

In additional embodiments, the pull-out gripper 20 of the apparatus 10 is designed in such manner that it has a linear axle which contains a longitudinal guide 24, a servomotor 23, and a toothed-belt drive with toothed belt 25, so that the pull-out gripper 20 can be displaced parallel to the wire-transport direction P1 (i.e. parallel to P2).

Sometimes with short wire-loops 2.1, when transporting the wire-loop 2.1 to the de-twisting apparatus 6, it can be advantageous if the pull-out gripper 20 slightly retracts in the direction of the loop-layer 4. Otherwise, under certain circumstances the wire-loop 2.1 could be excessively stretched, or even torn out of the pull-out gripper 20. Retraction of the pull-out gripper 20 possibly occurs shortly before the execution of a lateral movement P3 of the transfer unit 5, or during the execution of a lateral movement P3 of the transfer unit 5.

FIG. 2A shows the closed pull-out gripper 20 while pulling-out the lengthening wire-loop 2.1.

The pull-out gripper 20 is embodied in such manner that it grasps a piece of the wire 2 without gripping the latter tightly.

Figure 2B:
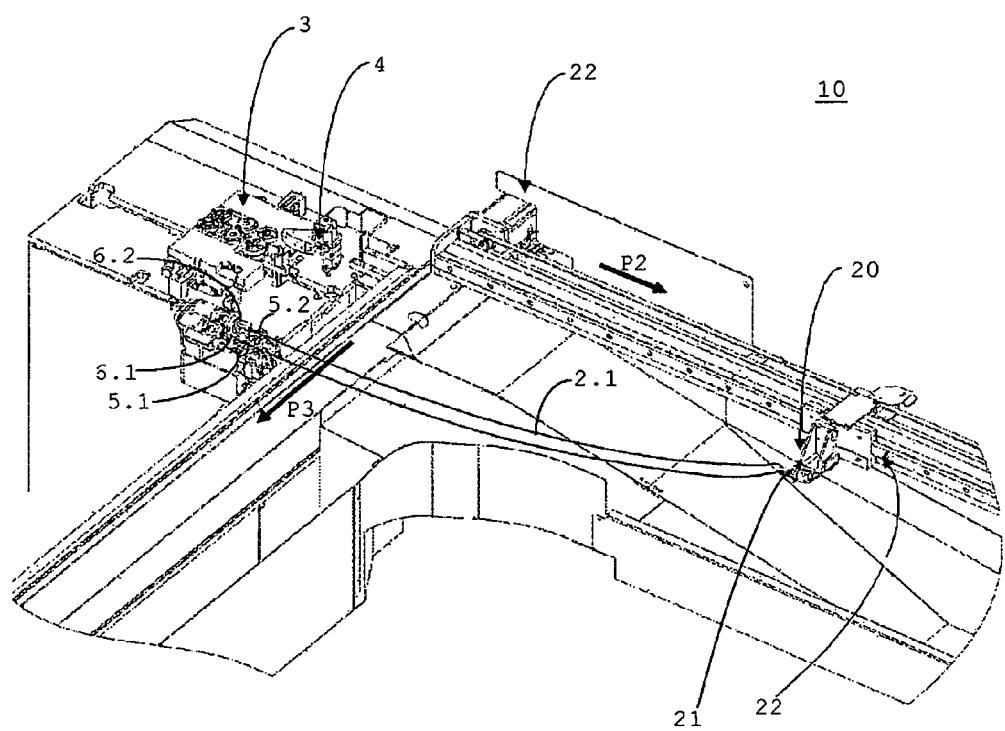
FIG. 2B, a three-dimensional view of a part of an apparatus with pull-out gripper according to FIG. 2A in a second instantaneous state.

In at least some embodiments the transfer unit 5 is fitted with two wire-grippers 5.1, 5.2 and can be moved on a guide that is arranged perpendicular to the direction of wire-transport (i.e. parallel to P3), so as to thereby transfer the two wire-ends of the loop 2.1 to two wire-grippers 6.1, 6.2 of the de-twisting apparatus 6. FIG. 2B shows the situation after the wire-loop 2.1 has been transferred from the transfer unit 5 to the de-twisting apparatus 6.

Further recognizable in FIG. 2B is that the pull-out gripper 20 has so enlarged the relative distance from the position of the loop-layer 4 that the wire-loop 2.1 is slightly taut. To maintain tautness, the control of the movement of the apparatus 10 can be designed in such manner that the pull-out gripper 20 constantly exerts on the wire-loop 2.1 a slight tensile force in the direction P2.

In the embodiment shown in FIGS. 2A and 2B, a slightly diagonal position of the wire-loop 2.1 results, since, on transfer from the loop-layer 4 to the de-twisting apparatus 6, the transfer unit 5 relative to the pull-out gripper 20 executes a transverse movement (here, P3 stands perpendicular to P2).

The arrangement of the axes can also be different. For example, the linear axis of the pull-out gripper 20 can run diagonally, or the pull-out gripper 20 can follow an arc-shaped path.

In some embodiments, the pull-out gripper 20 has two gripper-fingers 26.1, 26.2, which can be closed or opened by turning about a pin 28 that is arranged in a fork-piece 27. Corresponding details of such embodiments are shown in FIGS. 3A to 3E.

Figure 3A:
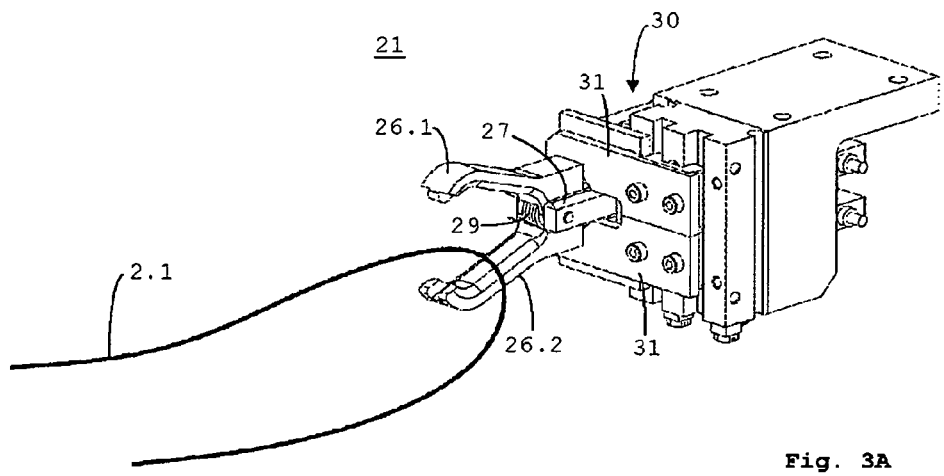
FIG. 3A, a three-dimensional view of a part of the pull-out gripper in an open state when grasping or releasing a wire loop.
Figure 3B:
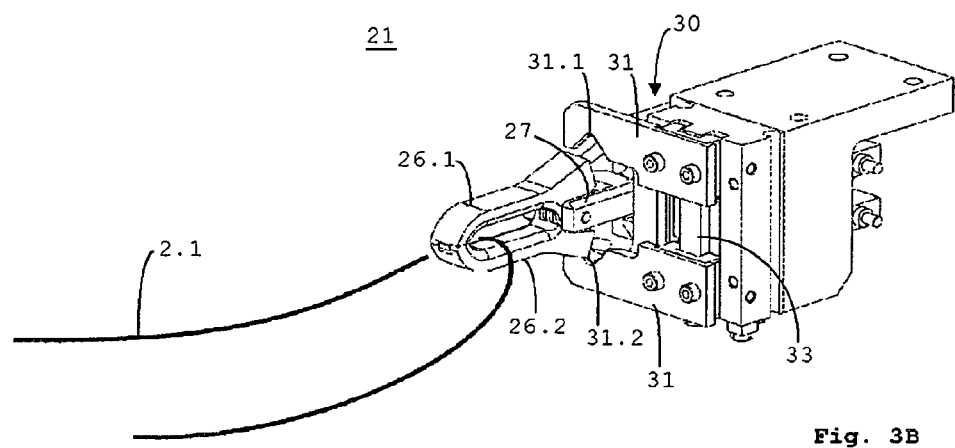
FIG. 3B, a three-dimensional view of the pull-out gripper according to FIG. 3A in a closed state with a grasped wire loop.
Figure 3C:
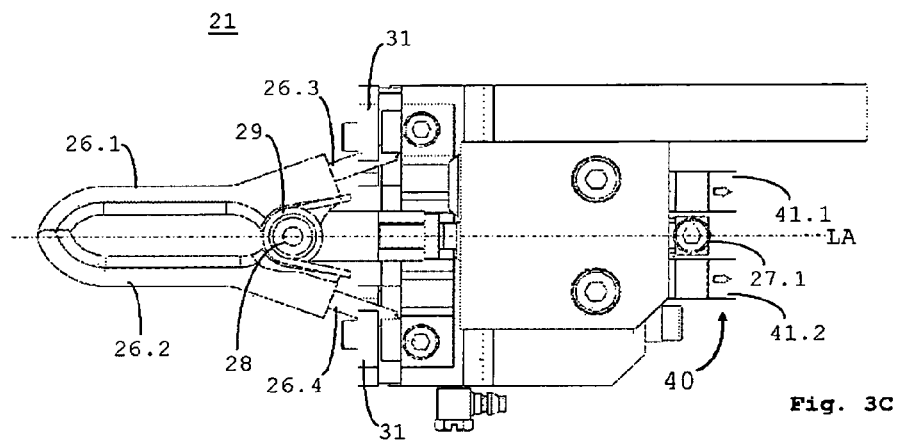
FIG. 3C, a side view of the pull-out gripper according to FIG. 3A in the closed state, wherein the wire loop is not shown.

In the embodiment shown, closing of the gripper-fingers 26.1, 26.2 is effected by a torsion spring 29 which is arranged on this pin 28 (see, for example, FIG. 3C). The torsion spring 29 applies a closing force to the back-ends of the gripper-fingers 26.1, 26.2. Hence, in the normal state, the gripper-fingers 26.1, 26.2 are closed.

Opening of the pull-out gripper 20, i.e. transition into an open state, is effected by the contrary movement of two gripper jaws 31 of a pneumatic, hydraulic, or motor-driven parallel gripper 30, which is arranged in the area of the fork-piece 27. The gripper jaws 31 possibly have V-shaped recesses 31.1, 31.2, which, on closure of the parallel gripper 30, press on the pins 26.3, 26.4 that are arranged on the ends of the gripper fingers 26.1, 26.2 and thereby effect opening of the pull-out gripper 20. The parallel gripper 30 possibly contains a guide 33 (see FIG. 3B), which serves to linearly guide the gripper jaws 31.

The gripper fingers 26.1, 26.2 of the pull-out gripper 20, and the fork piece 27 to which they are fastened, can turn freely within a certain angle about a longitudinal axis LA (parallel to the direction of the pulling-out movement P2). In at least some embodiments, to prevent crossing of the wire loop 2.1, this angle is less than 90 degrees.

The V-shaped recesses 31.1, 31.2 of the gripper jaws 31 of the parallel gripper 30 cause the gripper-fingers 26.1, 26.2 in the open state of the pull-out gripper 20 to stand vertical as shown in FIG. 3A.

This position can be maintained on closing of the gripper-fingers 26.1, 26.2, until the wire-loop 2.1 exerts no further torque on the pull-out gripper 20. Should there be twist in the wire-loop 2.1, the gripper-fingers 26.1, 26.2 turn in one direction or the other. In at least some embodiments, at an angle of maximum 90 degrees, this turning movement is stopped.

For this purpose, turning of the fork-piece 27 is limited by stops 32. In some embodiments in which the stops 32 are so embodied and positioned, the maximum angle is 70 degrees.

Figure 3D:
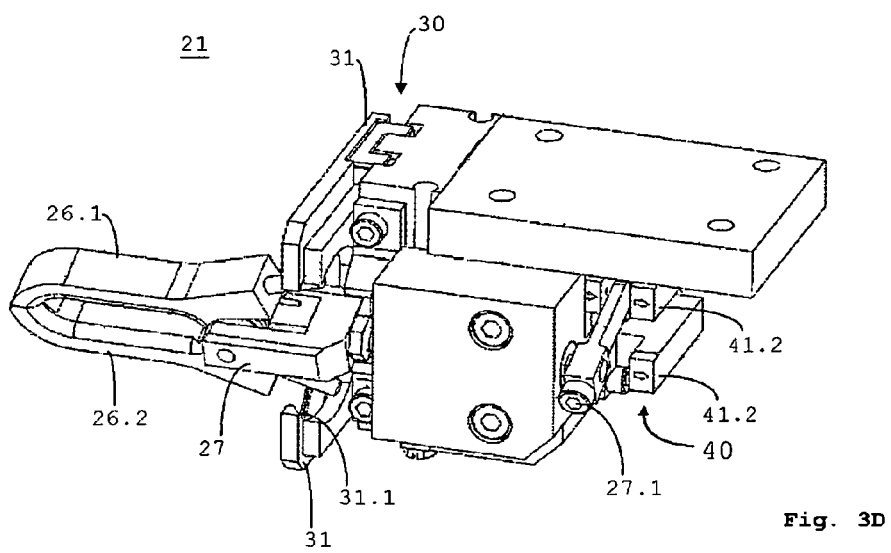
FIG. 3D, a three-dimensional view of the pull-out gripper according to FIG. 3A in a diagonal position in a closed state, wherein the wire loop is not shown.
Figure 3E:
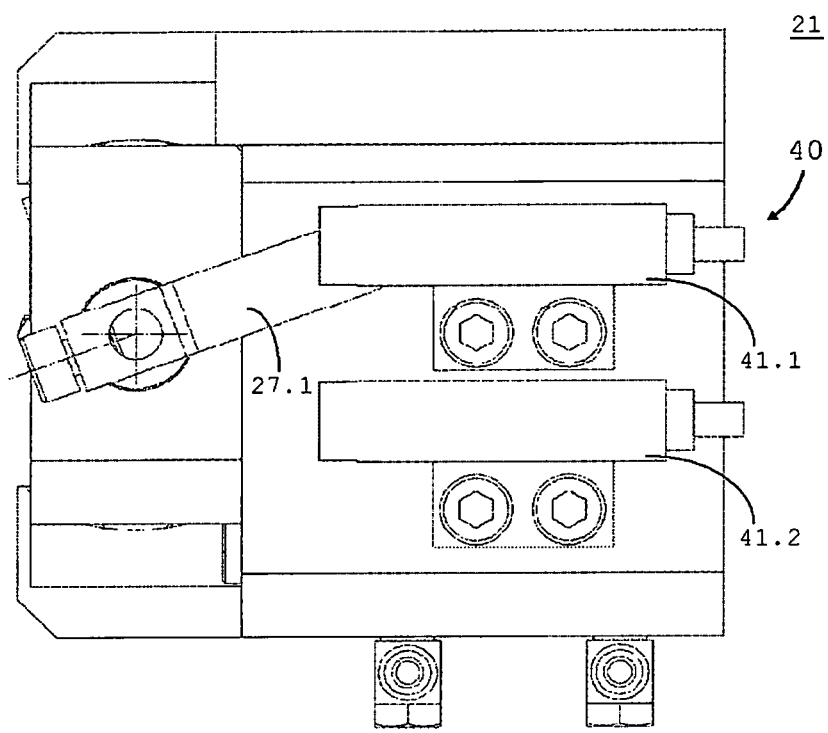
FIG. 3E, a back view of the pull-out gripper according to FIG. 3A, in which two optional light barriers are shown.

In further embodiments, fastened at the end of the fork-piece 27 can be a switching-vane 27.1, which can interrupt a first and a second (fork-)light-barrier 41.1, 41.2. Corresponding details are shown in FIG. 3D and FIG. 3E. The movement of the switching vane 27.1 can coupled with the turning movement of the gripper 21 about the axis LA.

Through this arrangement, the vertical position of the gripper-fingers 26.1, 26.2 (in this vertical position, in at least some cases, none of the (fork-)light-barriers 41.1, 41.2 is interrupted), or one of the two diagonal end-positions, is detected. In each of the two diagonal end-positions, only one of the two light-barriers 41.1, 41.2 is interrupted. Such a diagonal end-position is recognizable in FIG. 3D. The vertical position is shown, for example, in FIGS. 3A and 3B.

A sensor device 40 with the first and second (fork-)light-barriers 41.1, 41.2 can present a particularly inexpensive and also particularly robust variant. Depending on the state (interrupted by the switching-vane 27.1 or not), the two (fork-)light-barriers 41 deliver a digital signal which is directly placed at the disposal of a machine-control of the apparatus 10 or wire-processing machine 1 to control the de-twisting apparatus 6. In some cases, it is a disadvantage of this sensor device 40 that no intermediate values of the twist of the wire-gripper 21 can be measured or determined, and that also the vertical position of the gripper-fingers 26.1, 26.2 can only be determined approximately if both light-barriers 41 are uninterrupted. However, for the present applications, this type of sensor device 40 is, in at least some cases, adequate.

Other embodiments can be realized if, instead of the light-barriers 41.1, 41.2, for example capacitive or inductive proximity switches are employed which, for example, in the case of a certain angular position would also emit the presence of the switching vane 27.1 as a digital signal.

If the angular position of the gripper-fingers 26.1, 262 should be determined more accurately, another sensor device 40 with other sensors can be employed which, for example, can directly measure the twist of the longitudinal axis LA or of the fork-piece 27. For this purpose, rotation potentiometers, for example, which deliver an analog voltage value that depends on an angle of rotation, can be used, or absolute-value rotation transducers can be employed. This sensor device 40 then delivers the angular value directly as digital output signal to a machine-control of the apparatus 10 or wire-processing machine 1.

Independent of whether the sensors 41.1, 41.2 are optical, capacitive or inductive sensors, or a rotary potentiometer, or an absolute-value rotary transducer, they are part of the sensor device 40.

In at least some embodiments, the sensor apparatus 40 can be designed and constructed in such manner that it can also register information about the direction of the twist in the wire-loop 2.1. This information can be useful to enable starting of the de-twisting operation in the correct direction. For this reason, the information about the direction of the twist of the sensor apparatus 40 is passed on to a machine-control of the apparatus 10 or wire-processing machine 1. However, to determine the direction of the twist, a separate sensor apparatus can also be employed, which operates independent of the sensor apparatus 40.

The basis of the twist measurement (i.e. the measurement of the twist and/or the determination of the direction of the twist and/or the determination of the twist-free state) can be that in the pull-out gripper 20, gripper-fingers 26.1, 26.2 are employed that are rotatably borne about the longitudinal axis LA. Bearing of the gripper-fingers 26.1, 26.2 on a rotatable fork-piece 27 is used in some embodiments.

Depending on the embodiment, either, first a wire-piece is separated from a wire 2 and then grasped by the means 3, 4 (e.g. in interplay of a wire-drive 3 and a loop-layer 4) and in interaction with the pull-out gripper 20 formed into a loop 2.1; or, the loop 2.1 is simultaneously formed while the wire 2 is pushed, or pulled, by the wire-drive 3 into the apparatus 10, as shown in FIG. 2A.

After the loop has been laid, the gripper 21 grasps the wire 2 of the wire-loop 2.1.

In further embodiments, the gripper 21 grasps the wire 2 of the wire-loop 2.1 at the start of the loop formation, as shown in FIG. 2A. Such embodiments can deliver particularly good results in relation to reproducibility and productivity, since the wire-loop 2.1 can be constantly held under slight tensile force to prevent crossing. When being formed, the wire-loop 2.1 is pulled out taut by means of the movement apparatus 22.

If the gripper 21 grasps the wire 2 of the wire-loop 2.1 before or during the loop-formation, the gripper 21 is moved through the movement apparatus 22 synchronously with formation of the loop 2.1. In some embodiments, the movement apparatus 22 executes a linear movement of the gripper 21 in the longitudinal direction of the loop 2.1, which corresponds to approximately half of the velocity of the wire 2 in the direction P1. If the wire 2 has a velocity v1 in the direction P1, the velocity v2 of the gripper 21 in the direction P2 is approximately v1/2.

In some cases, there is monitoring of the twist of the loop 2.1 (so-called "twist detection") and/or monitoring that allows a statement to be made as to whether the twist was successfully removed (detection of the so-called "twist-free state"). Twist-detection and/or detection of the twist-free state can take place at the pull-out gripper 20, possibly at the gripper 21 itself (e.g. with a sensor device 40, as already mentioned), or it can take place by means of a separate sensor device 40.

A separate sensor device 40 can contain, for example, a CCD camera together with a pattern-recognition software, which is able to digitally analyze an image of the CCD camera and, based on the analysis (e.g. by comparison of a pattern with previously saved images), to allow a statement about the instantaneous twist, including the direction of twist. Such a CCD-based sensor device can also detect the twist-free state by reference to such a pattern-comparison.

Various alternative embodiments of the pull-out gripper 20 are possible, which can be employed in association with the various embodiments that have been described.

The functionality of the pull-out gripper 20 can, for example, also be obtained through alternative constructions. For example closing and opening of the gripper-fingers 26.1, 26.2 can be directly effected pneumatically, hydraulically, or motor-driven;

movement of the gripper-fingers 26.1, 26.2 into the vertical can be effected by a part that is pressed against the side of the fork-piece 27;

movement of the gripper-fingers 26.1, 26.2 into the vertical can be effected by tension springs;

movement of the gripper-fingers 26.1, 26.2 into the vertical can be effected by an electromagnet;

the angular position of the gripper-fingers 26.1, 26.2 can be measured by an (angular) encoder.

The apparatus 10 can also be used in association with machines in which the wire-loop 2.1 is formed in different manner, as disclosed, for example, in Patent Application EP0883917 for a wire-processing machine according to the swivel-arm principle that was mentioned at the outset.

Based on the greatly simplified sketch of the principle of FIGS. 4A to 4E, described below are exemplary details of the method for forming a wire-loop 2.1.

In a first step, a wire 2 is inserted into an apparatus 10, which for this purpose contains a wire drive 3 (here symbolized by two rollers). The leading end of the wire 2 can be grasped by the gripper of a loop layer 4. The loop layer 4 is embodied in such manner that it can execute a swivel movement along a path 34. On execution of this swivel movement, the gripper of the loop layer 4 executes, for example, a rotation of 180 degrees. In this manner, the wire loop 2.1 is laid.

Figure 4A:
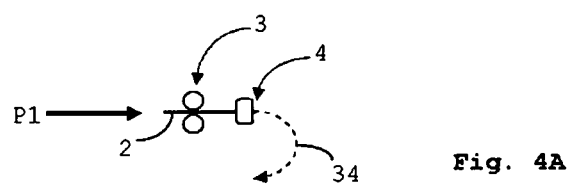
FIG. 4A, a greatly simplified sketch of the principle of a wire-processing machine when inserting a wire piece.
Figure 4B:
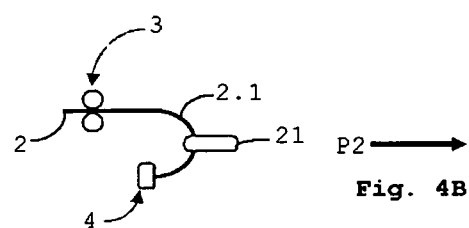
FIG. 4B, a greatly simplified sketch of the principle of the wire-processing machine according to FIG. 4A when forming a wire loop and after grasping the wire loop with the pull-out gripper.

After laying the wire loop 2.1, the gripper 21 grasps the wire loop 2.1. This state is shown in FIG. 4B. For this purpose, the gripper 21 of the pull-out gripper 20 is previously transposed into the open state (as shown, for example, in FIG. 3A). The gripper 21 then grasps the wire 2 at a curved portion of the wire loop 2.1, and the gripper 21 is then transposed into a closed state in which it loosely grasps the wire loop curved portion area. This state is shown, for example, in FIG. 3B.

Figure 4C:
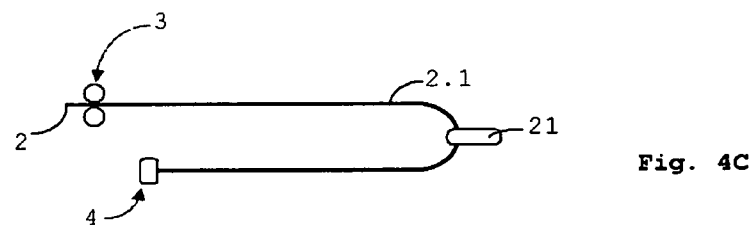
FIG. 4C, a greatly simplified sketch of the principle of the wire-processing machine according to FIG. 4A after the wire loop has been pulled out.

A relative movement P2 of the pull-out gripper 20 relative to the wire drive 3 and the loop layer 4 is executed, so as to apply slight tension in longitudinal direction to the wire loop 2.1 during formation of the wire loop 2.1. The final state of this pulling-out movement is shown in FIG. 4C.

Figure 4D:
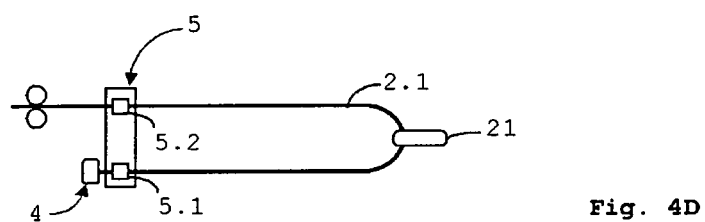
FIG. 4D, a greatly simplified sketch of the principle of the wire-processing machine according to FIG. 4A after transfer of the wire loop to a transfer unit.

The two ends of the wire loop 2.1 are now transferred to the grippers 5.1, 5.2 of the transfer unit 5. This instant is indicated in FIG. 4D.

Figure 4E:
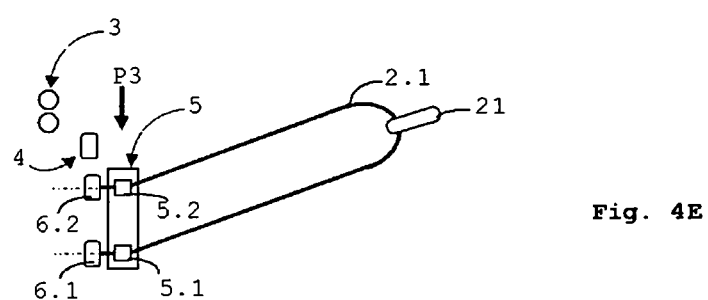
FIG. 4E, a greatly simplified sketch of the principle of the wire-processing machine according to FIG. 4A after the execution of a transfer movement and before transfer of the wire loop from the transfer unit to a de-twisting apparatus.

For the purpose of transferring the two ends of the wire loop 2.1 to the grippers 6.1, 6.2 of the de-twisting apparatus 6, a lateral movement P3 is then executed. This instant is indicated in FIG. 4E.

A method for de-twisting the wire loop 2.1 can now be employed. The direction and/or number of de-twisting turns can be derived from the detected twist. The de-twisting turning takes place about the longitudinal axis of the wire. When executing the de-twisting turning, either, only one of the two grippers 6.1 or 6.2 of the de-twisting apparatus 6 turns, or, the two grippers 6.1 and 6.2 turn in opposite directions.

In some cases, to detect the twist-free state of the wire loop 2.1, a sensor device 40 is employed. As soon as the twist-free state is detected, the method for de-twisting can be terminated. Should no detection of the twist-free state occur, the method for de-twisting can be terminated when a pre-defined number of de-twisting turns has been executed.

Having illustrated and described the principles of the disclosed technologies, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only examples of the technologies and should not be taken as limiting the scope of the invention. Rather, the scope of the invention is defined by the following claims and their equivalents. We therefore claim as our invention all that comes within the scope and spirit of these claims.

We claim:

1. An apparatus for forming a wire loop, the apparatus comprising:
    a wire drive configured to advance a wire in a longitudinal direction;
    a loop layer configured to grip a first end of the wire and to lay a wire loop, wherein a size of the wire loop is set by advancing the wire; and
    a pull-out gripper configured to receive the wire loop by grasping an area at a curved portion of the wire loop spaced from the first end and move relative to the loop layer to tension the wire loop in the longitudinal direction, when the pull-out gripper is in a closed state, the grasped curved portion area of the wire loop extends between the two gripper fingers and is free to move relative to the two gripper fingers, and
    wherein a portion of the pull-out gripper is selectively free turning within a certain angle about a longitudinal axis parallel to the longitudinal direction, the pull-out gripper includes a gripper and a sensor device, the sensor device configured to detect a twist in the wire loop.

2. An apparatus for forming a wire loop, the apparatus comprising:
    a wire drive configured to advance a wire in a longitudinal direction;
    a loop layer configured to grip a first end of the wire and to lay a wire loop, wherein the loop layer is positionable to grip the first end of the wire when the wire is advanced in the longitudinal direction by the wire drive, the loop layer configured to make a swivel movement along a path and lay the wire loop, and a size of the wire loop is set by advancing the wire; and
    a pull-out gripper configured to receive the wire loop by grasping an area at a curved portion of the wire loop spaced from the first end and configured to move relative to the loop layer to tension the wire loop in the longitudinal direction when the wire is further advanced by the wire drive, wherein the pull-out gripper moves away from the wire drive and the loop layer when the wire is further advanced by the wire drive;
    wherein a portion of the pull-out gripper is selectively free turning within a certain angle about a longitudinal axis parallel to the longitudinal direction, the pull-out gripper includes a gripper and a sensor device, the sensor device configured to detect a twist in the wire loop.

3. The apparatus of claim 2, the sensor device being configured to detect a direction of the wire.

4. The apparatus of claim 2, the sensor device being configured to detect a twist-free state of the wire loop.

5. The apparatus of claim 2, the sensor device configured to contactlessly detect a direction of a twist in the wire loop.

6. The apparatus of claim 2, the sensor device configured to contactlessly detect a twist-free state of the wire loop.

7. The apparatus of claim 2, the gripper comprising two gripper fingers, the two gripper fingers being displaceable into an open state.

8. The apparatus of claim 7, the gripper further comprising two gripper jaws, the two gripper jaws being displaceable along a guide to place the two gripper fingers into the open state.

9. The apparatus of claim 2, the gripper comprising two gripper fingers, the two gripper fingers being coupled to a fork piece, the fork piece being at least partially rotatable about the longitudinal axis parallel to the longitudinal direction.

10. The apparatus of claim 2, wherein the portion of the pull-out gripper is selectively free turning up to 70 degrees about a longitudinal axis parallel to the longitudinal direction.

11. A wire-loop method for forming a wire loop, the method comprising:
    advancing a wire in a longitudinal direction using a wire drive;
    laying a wire loop with a loop layer configured to grip a first end of the wire, wherein a size of the wire loop is set by advancing the wire;
    receiving the wire loop using an open pull-out gripper;

closing the pull-out gripper about an area at a curved portion of the wire spaced from the first end to loosely grasp the area; and pulling the wire loop using the pull-out gripper to tension the wire loop in the longitudinal direction, wherein a portion of the pull-out gripper is selectively free turning within a certain angle about a longitudinal axis parallel to the longitudinal direction, the pull-out gripper includes a gripper and a sensor device, the sensor device configured to detect a twist in the wire loop.

12. The method of claim 11 including detecting a twist in the wire loop using the sensor.

13. The method of claim 12 including de-twisting the wire loop, a number of de-twisting turns being based on the detected twist.

14. The method of claim 11 including detecting a direction of a twist in the wire loop using the sensor.

15. The method of claim 14 including de-twisting the wire loop, the direction of the de-twisting being based on the detected direction of the twist.

16. The method of claim 11 including detecting a twist-free state of the wire loop using the sensor.

17. The method of claim 11 further comprising:

feeding the wire loop into a de-twisting device with a lateral movement relative to the longitudinal direction; and retracting the pull-out gripper before or during the lateral movement.

* * * * *